US006983003B2

(12) United States Patent
Sonobe et al.

(10) Patent No.: US 6,983,003 B2
(45) Date of Patent: Jan. 3, 2006

(54) III-V NITRIDE SEMICONDUCTOR LASER DEVICE

(75) Inventors: Masayuki Sonobe, Kyoto (JP); Yoshinori Kimura, Tsurugashima (JP); Atsushi Watanabe, Tsurugashima (JP)

(73) Assignees: Rohm Co., Ltd., Kyoto (JP); Pioneer Corporation, Tokyo (JP)

( * ) Notice: Subject to any disclaimer, the term of this patent is extended or adjusted under 35 U.S.C. 154(b) by 178 days.

(21) Appl. No.: 09/954,221

(22) Filed: Sep. 18, 2001

(65) Prior Publication Data

US 2002/0071465 A1 Jun. 13, 2002

(30) Foreign Application Priority Data

Sep. 19, 2000 (JP) ........................................ 2000-283393

(51) Int. Cl.
*H01S 5/00* (2006.01)

(52) U.S. Cl. ............................. 372/45; 372/43; 372/42; 372/46

(58) Field of Classification Search .................. 172/45, 172/46, 43; 257/44; 372/45, 42, 46
See application file for complete search history.

(56) References Cited

U.S. PATENT DOCUMENTS 5,889,295 A * 3/1999 Rennie et al. ................ 257/96
6,150,672 A * 11/2000 Kaneko ........................ 257/94
6,172,382 B1 * 1/2001 Nagahama et al. ........... 257/94
6,252,894 B1 * 6/2001 Sasanuma et al. ............ 372/45
6,259,122 B1 * 7/2001 Ota et al. ................... 257/101
6,266,355 B1 * 7/2001 Sverdlov ..................... 372/45
6,333,945 B1 * 12/2001 Abe et al. ..................... 372/46
6,535,536 B2 * 3/2003 Fukunaga et al. ............ 372/45

* cited by examiner

*Primary Examiner*—Minsun Oh Harvey
*Assistant Examiner*—Dung Nguyen
(74) *Attorney, Agent, or Firm*—Morgan, Lewis & Bockius LLP

(57) ABSTRACT

A III–V nitride semiconductor laser device demonstrates an excellent emission characteristic without an increase in production cost. The refractive index of a p-side optical guiding layer is larger than that of an n-side guide layer.

7 Claims, 9 Drawing Sheets

III-V NITRIDE SEMICONDUCTOR LASER DEVICE

BACKGROUND OF THE INVENTION

1. Technical Field

The present invention relates to a nitride semiconductor laser device.

2. Description of Related Art

An SCH (Separate Confinement Heterostructure) is a widely used structure in semiconductor laser diodes. In SCH laser diodes, the injected carriers are confined to the active layer by the band step at the interface between the active layer and the optical guiding layer, while the optical field is confined to the optical guiding layers and the active layer by the refractive index step at the interface between the optical guiding layer and the cladding layer. In the laser diodes composed of III–V nitride semiconductor, which is described by the notation of $(Al_xGa_{1-x})_{1-y}In_yN$ ($0 \leqq x \leqq 1$, $0 \leqq y \leqq 1$), the SCH is used as well as laser diodes composed of conventional semicondutors. However, achieving good optical field is difficult in the III–V nitride semiconductor laser diodes because of its difficulty of obtaining the high quality $Al_xGa_{1-x}N$ epitaxial layer with sufficient thickness and Al mode fraction for the optical confinement. Therefore, the threshold current density and FFP (Far-Field Pattern) of III–V nitride semiconductor laser diodes are inferior to that of the laser diodes composed of conventional semiconductors because of its poor optical confinement.

As shown in FIG. 1, the conventional III–V nitride semiconductor laser diode has a multiple layer structure epitaxially grown on a substrate 1 of single crystalline sapphire. FIG. 1 also shows the multiple layer structure of the III–V nitride semiconductor laser diode of an embodiment of the instant invention which will be described later.

The spitaxial layers consist of a GaN or AlN buffer layer 2 grown at a low temperature, an n-type GaN base layer 3, an n-type ALGaN cladding layer 4, an n-side GaN optical guiding layer 5, an active layer 6 essentially consisting of InGaN, and AlGaN electron barrier layer 7, a p-side GaN optical guiding layer 8, a p-type AlGaN cladding layer 9, and a p-type GaN contact layer 10.

An n-electrode 12*a* and a p-electrode 12*b* are deposited on the base layer 3 and the contact layer 10 via windows of an insulating layer 11, respectively. In order to get high-quality and smooth single crystalline layers, the buffer layer 2 is firstly grown in the sapphire substrate 1. The base layer 3 is grown as contact layer for n-electrode because the sapphire substrate 1 is an insulator.

As described above, the light confinement of the conventional SCH III–V nitride semiconductor laser diodes can be improved by (1) increasing the thickness of the cladding layer 4 or (2) lowering the refractive index of the cladding layer 4.

With the scheme (1) in use, in the case where the cladding layer 4 of AlGaN having a smaller lattice constant than GaN is formed on the base layer 3 of GaN, tensile stress is produced inside the cladding layer 4. This makes it easier to form cracks. When the thickness of the cladding layer 4 becomes large, particularly, the tendency becomes prominent. Such cracks in the cladding layer 4 degrades the emission characteristic of the laser diode.

A strain relaxing layer (not shown) grown between the base layer 3 and the cladding layer 4 relax the lattice unmatch. Using the strain relaxing layer, the cracks can be reduced in the cladding layer 4 and the thicker cladding layer 4 can be achieved. For example, the strain relaxing layer made from InGaN and a thickness is about 0.1 to 0.2 $\mu$m. However, distortion energy for relaxing lattice mismatch is stored in the strain relaxing layer as a strain and significantly degrades the crystal quality of the strain relaxing layer. In addition, the strain stored in the strain relaxing layer produces new dislocations, and it degrades optical gain in active layer. Therefore, the threshold current density increases.

Further, the scheme (1) is disadvantageous in increasing the grouth time for the cladding layer 4 as well as increasing the thickness thereof, thus increasing the production cost.

According to the scheme (2), the refractive index of the cladding layer 4 can be reduced by increasing the Al mole fraction in the cladding layer 4. When the Al mole fraction increases, the lattice constant of the AlGaN decreases. As a result, greater tensile stess acts on the cladding layer 4, producing cracks in the cladding layer 4.

In addition to the schemes (1) and (2), there is another scheme which improves the optical confinement by increasing the refractive index of the guiding layer 5, not reducing the refractive index of the cladding layer 4. For example, even a slight amount of In can increase the refractive index considerably. The optical guiding layer 5 having a high refractive index can improve the optical confinement without increasing the thickness of the cladding layer 4.

When InGaN is grown by metal organic chemical vapor deposition (MOCVD), pits having a nearly V-shaped cross section occur on the surface. The pits are initiated from the dislocation in the underlying layers and grow in proportion to the thickness of InGaN layer to be grown. To improve the optical confinement for the active layer 6, the optical guiding layer 5 should have a certain degree of thickness. Therefore the very large pits occur in the surface of the optical guiding layer 5. Even if the active layer 6 grown over the optical guiding layer 5 with large bits has a flat surface, the light guided within the waveguide region include the active layer 6, the optical guiding layer 5 and the optical guiding layer 7 is scatterred by the large pits, thus the occurrence of large pits causes the deterioration of laser characteristic. In other words, while the use of InGaN for the optical guiding layer can increase the refractive index of the optical guiding layer, it also increases the scattering loss, thus resulting in an increase in threshold current density.

OBJECT AND SUMMARY OF THE INVENTION

Accordingly, it is an object of the present invention to provide a semiconductor laser device which demonstrates an excellent emission characteristic without increasing the production cost.

A nitride semiconductor laser device according to the invention is a III–V nitride semiconductor laser device which comprises an n-side AlGaN cladding layer; an n-side guide layer; an active layer; a p-side guide layer; and a p-side AlGaN cladding layer, a refractive index of the p-side guide layer being larger than that of the n-side guide layer.

DETAILED DESCRIPTION OF THE PREFERRED EMBODIMENTS

While the composition ratios of the materials for individual constituting layers of a semiconductor laser device according to the present invention partially differ from those of the materials for corresponding layers of the conventional III–V nitride semiconductor laser diode, the semiconductor laser device of the present invention has a cross-sectional structure similar to that of the conventional one.

Figure 1:
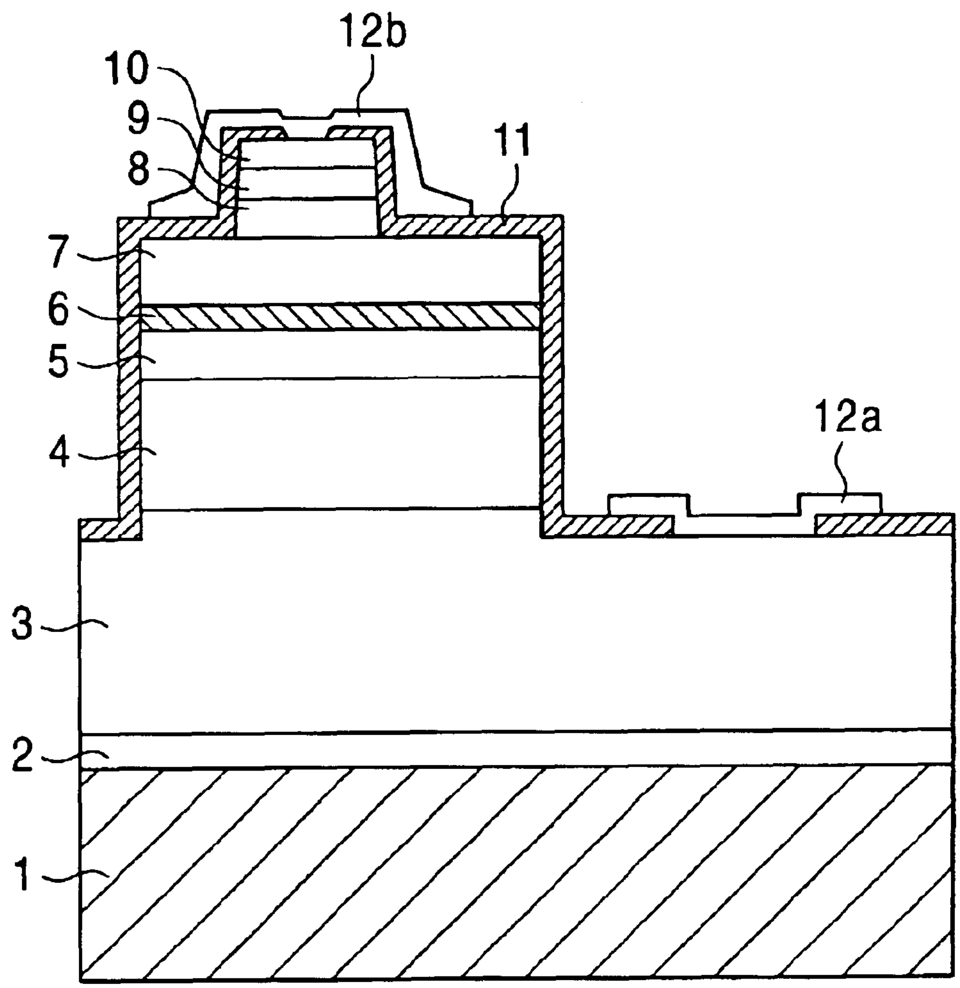
FIG. 1 is a cross-sectional view of a III–V nitride semiconductor laser device.

This is described below with reference to FIG. 1. A low-temperature buffer layer 2 of AlN, GaN or the like is grown on a sapphire substrate 1, and an n-side GaN base layer 3 doped with Si or the like to have a conductivity is grown to about 4 to 6 μm thick on the buffer layer 2. An n-side $Al_xGa_{1-x}N$ cladding layer 4 having an Al mole fraction x =0.06 and a thickness of 0.6 μm and an n-side GaN optical guiding layer 5 are grown on the base layer 3. Then, an MQW active layer 6 having five layers of $In_{y1}Ga_{1-y1}N$ (y1=0.08, 30 Å)/$In_{y2}Ga_{1-y2}N$ (y2=0.01, 60 Å) is grown as an emission layer on the optical guiding layer 5. Then, an $Al_xGa_{1-x}N$ electron barrier layer 7 having a thickness of 0.02 μm, a p-side $In_yGa_{1-y}N$ optical guiding layer 8 doped with magnesium to be a p type, a p-side $Al_xGa_{1-x}N$ cladding layer 9 having a thickness 0.4 μm and the Al mole fraction x=0.06 and a p-side contact layer 10 having a thickness of 0.1 μm are grown in order on the MQW active layer 6. A p-electrode 12*b* and an n-electrode 12*a* are respectively deposited on the p-side contact layer 10 and the n-side GaN base layer 3 via windows of an insulating layer 11.

Because the n-side optical guiding layer in the semiconductor laser device of the present embodiment is formed of GaN, no pit is formed in the surface of the n-side optical guiding layer 5 after growth thereof so that the aforementioned problem of the scattering loss will not arise. As the p-side optical guiding layer 8 is formed of InGaN to increase the refractive index, the optical confinement efficiency can be improved.

Doping InGaN with magnesium suppresses the occurrence of the pits. As the p-side optical guiding layer 8 is doped with magnesium as a p-type dopant, the pits that increases the scattering loss don't occur advantageously.

The level of the refractive index of the p-side optical guiding layer 8 formed of $In_yGa_{1-y}N$ can be controlled by adjusting the In mole fraction y. That is, the optical confinement state can be controlled. Increasing the In mole fraction y in the p-side optical guiding layer 8 can increase the refractive index of the p-side optical guiding layer 8. It is preferable that the p-side optical guiding layer 8 formed of $In_yGa_{1-y}N$ should have a thickness of 0.05 μm or greater and the In mole fraction y of 0.005 or greater, as the settings improve the emission characteristic of the laser device.

The following discusses the results of simulation on the emission characteristics of the semiconductor laser device of the present invention and the comparative example.

Figure 2:
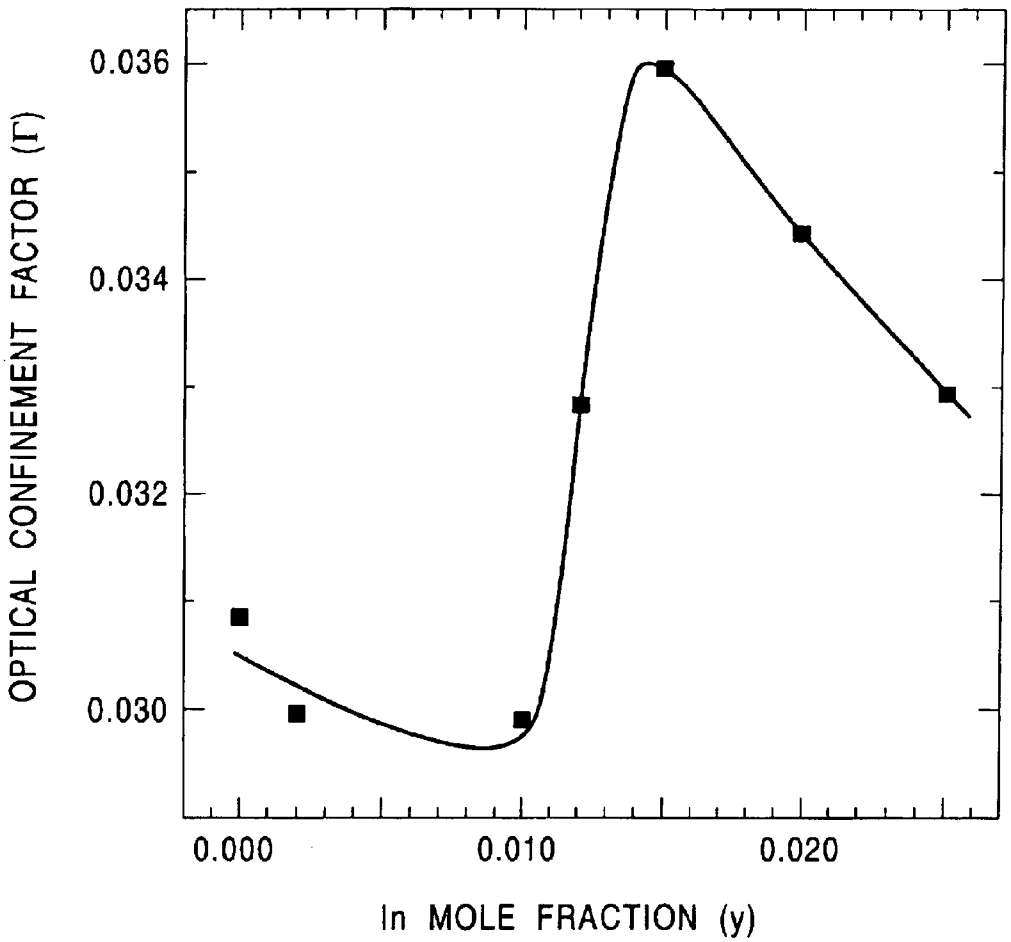
FIG. 2 is a graph showing the relationship between the In mole fraction in a cladding layer and an optical confinement factor.

FIG. 2 shows the dependency of the optical confinement factor P for the active layer 5 on the In mole fraction y of the p-side optical layer 8 with the thicknesses of both the n-side optical guiding layer 5 and the p-side optical guiding layer 8 set to 0.2 μm, optical confinement factor Γ in the active layer was acquired as the In mole fraction y was varied to change the refractive index of the p-side $In_yGa_{1-y}N$ optical guiding layer 8.

As the In mole fraction y increases, the optical confinement factor Γ rises sharply particularly in the vicinity of y=0.015, then gently falls thereafter. That is, in the case of the thicknesses of the n-side optical guiding layer 5 and the p-side optical guiding layer 8 are both 0.2 μm, a good optical confinement is achieved when the In mole fraction y is larger than 0.015.

As shown in FIGS. 3 through 6, with the thicknesses of both the n-side optical guiding layer 5 and the p-side optical guiding layer 8 set to 0.2 μm, the optical field distributions in the growth direction of the device and the far field patterns were calculated as the In mole fraction y was varied from 0 (comparative example) to 0.010 and 0.015 (or greater in the present invention) in order to change the refractive index of the p-side $In_yGa_{1-y}N$ optical guiding layer 8. In the refractive index distributions in FIGS. 3 to 5, the refractive indexes of the individual layers that constitute the device are shown with the same numerals as those denoting the layers in FIG. 1.

Figure 3:
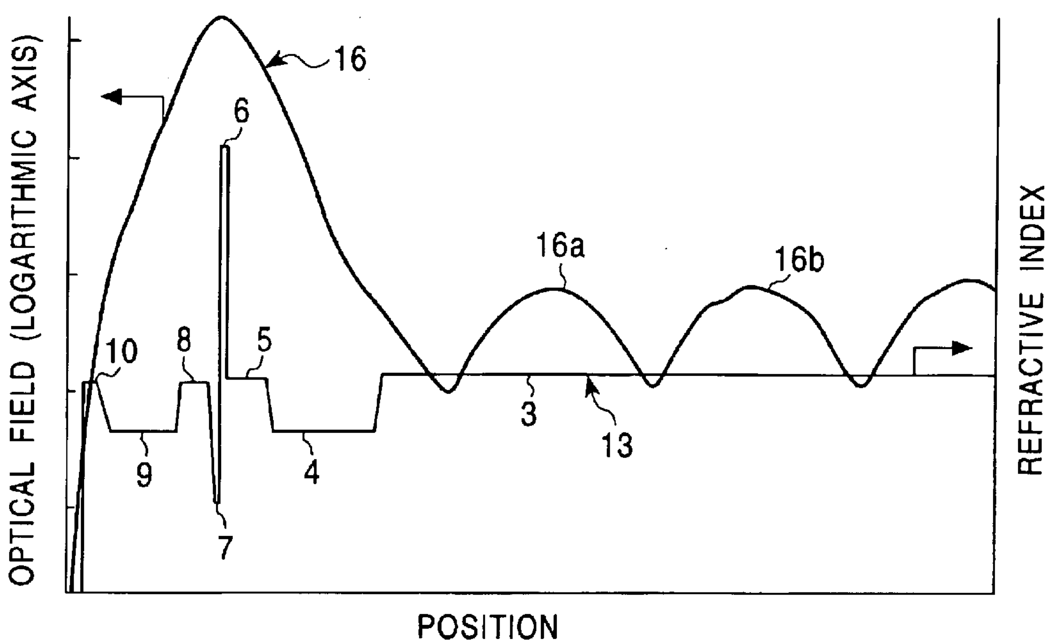
FIG. 3 is a diagram (each axis of which is of an arbitrary unit) showing a refractive index of a semiconductor laser device (In mole fraction y=0) as a comparative example in the depositing direction and an optical field (logarithmic axis) distribution in the device.

When the In mole fraction y is equal to 0 as in the comparative example, i.e., when the p-side optical guiding layer 8 is formed of GaN, the same material as used for the n-side optical guiding layer 5 and the refractive index of the optical guiding layer 8 is the same as those of the n-side optical guiding layer 5 and the base layer 3, an optical field distribution 16 has peaks in the portion of the base layer 3 as indicated by 16*a* and 16*b* as well as a peak in the vicinity of the active layer 6 including the n-side optical guiding layer 5 and the p-Bide optical guiding layer 8, as shown in FIG. 3.

Figure 7A:
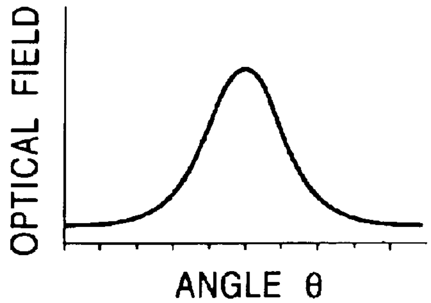
FIGS. 7A through 7C are diagrams showing the far field patterns at individual points in FIG. 6.
Figure 7B:
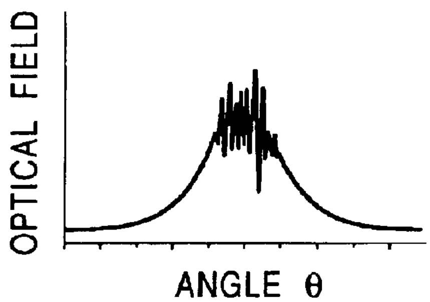
Figure 7C:
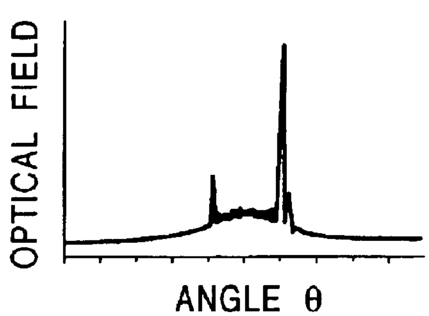

The far field pattern in the growth direction in the above condition has multiple narrow and sharp peaks as shown in FIG. 7C and is not desirable. The far field pattern in the depositing direction is well affected by the optical field distribution in the device. That is, when the optical confinement near the active layer 6 is weak and optical field leaks into the base layer 3, the far field pattern has a multi-peak shape having narrow and sharp peaks. When the optical confinement near the active layer 6 inside the device is adequate, the narrow and sharp peaks in the far field pattern become relatively small and the pattern approaches a wide single-peak pattern.

Figure 4:
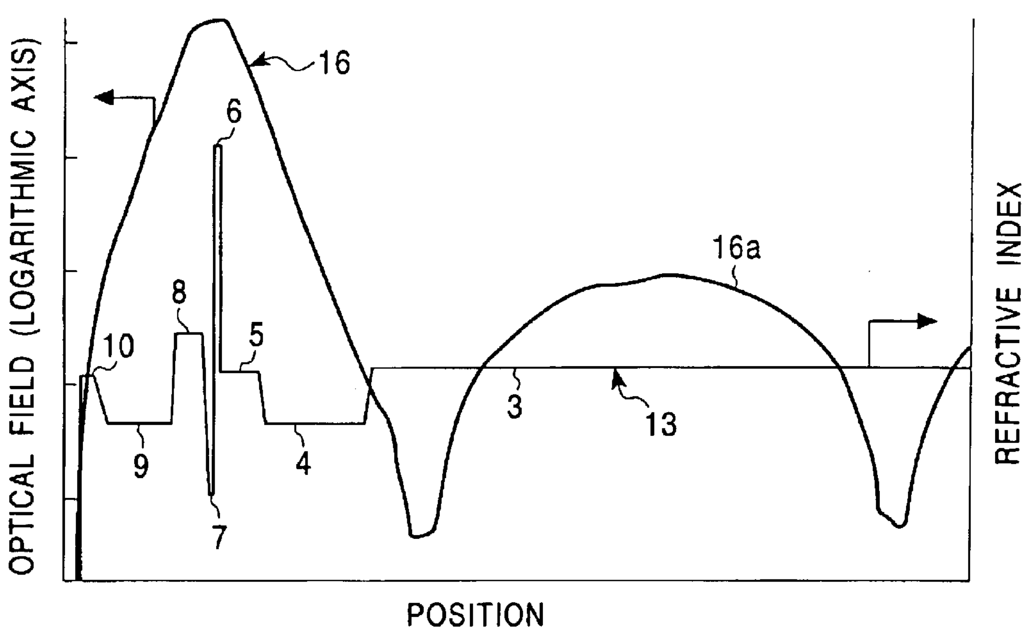
FIG. 4 is a diagram (each axis of which is of an arbitrary unit) showing a refractive index of a semiconductor laser device (In mole fraction y=0.010) of the present invention in the growth direction and an optical field (logarithmic axis) distribution in the device.

Even when the In mole fraction y is 0.010, i.e., even when the refractive index of the p-side optical guiding layer 8 is slightly higher than that of the n-side optical guiding layer 5, the optical field distribution 16 has a peak 16*a* in the portion of the base layer 3, as shown in FIG. 4. That is, optical field leaks into the base layer 3. Further, the far field pattern in this case has a multi-peak pattern as shown in FIG. 7B, which is closer to a wide single-peak pattern than the one in shown in FIG. 7C. In other words, it is apparent that the optical confinement in the device has been improved as compared with the case where the In mole fraction y is equal to 0.

Figure 5:
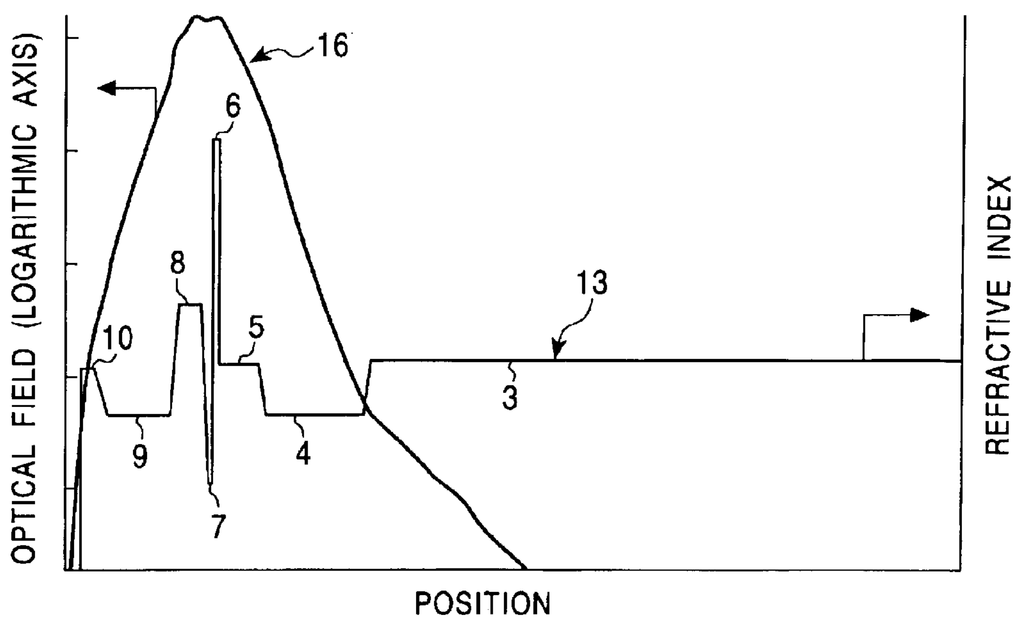
FIG. 5 is a diagram (each axis of which is of an arbitrary unit) showing a refractive index of a semiconductor laser device (In mole fraction y=0.015) of the present invention in the growth direction (arbitrary unit) and an optical field (logarithmic axis) distribution in the device.

Further, as shown in FIG. 5, when the In mole fraction y according to the present invention is 0.015, i.e., when the refractive index of the p-side optical guiding layer 8 is higher than that in the case shown in FIG. 4, it is apparent that the optical field distribution 16 is concentrated in the vicinity of the active layer 6 including the n-side optical guiding layer 5 and the p-side optical guiding layer 8, emission occurs in the active layer 6 and the light that is wave guided inside the device is well confined near the active layer 6. The far field pattern then has a wide single-peak pattern as shown in FIG. 7A, which has no narrow and sharp peaks observed and is very desirable as the emission characteristic of the device.

The above is the case where the thicknesses of both the n-side optical guiding layer 5 and the p-side optical guiding layer 8 are set to 0.2 μm. Next, the optical field leakage to the base layer 3 and the optical field distribution of the far field pattern were acquired as the In mole fraction y in the p-side $In_yGa_{1-y}N$ optical guiding layer 8 and the thickness thereof were changed. Note that the n-side optical guiding layer 5 is formed of GaN and the n-side optical guiding layer 5 and the p-side optical guiding layer 8 have the same thickness. That is, when the thickness of the p-side optical guiding layer 8 is 0.1 μm, the thickness of the n-side optical guiding layer 5 is also 0.1 μm.

Figure 6:
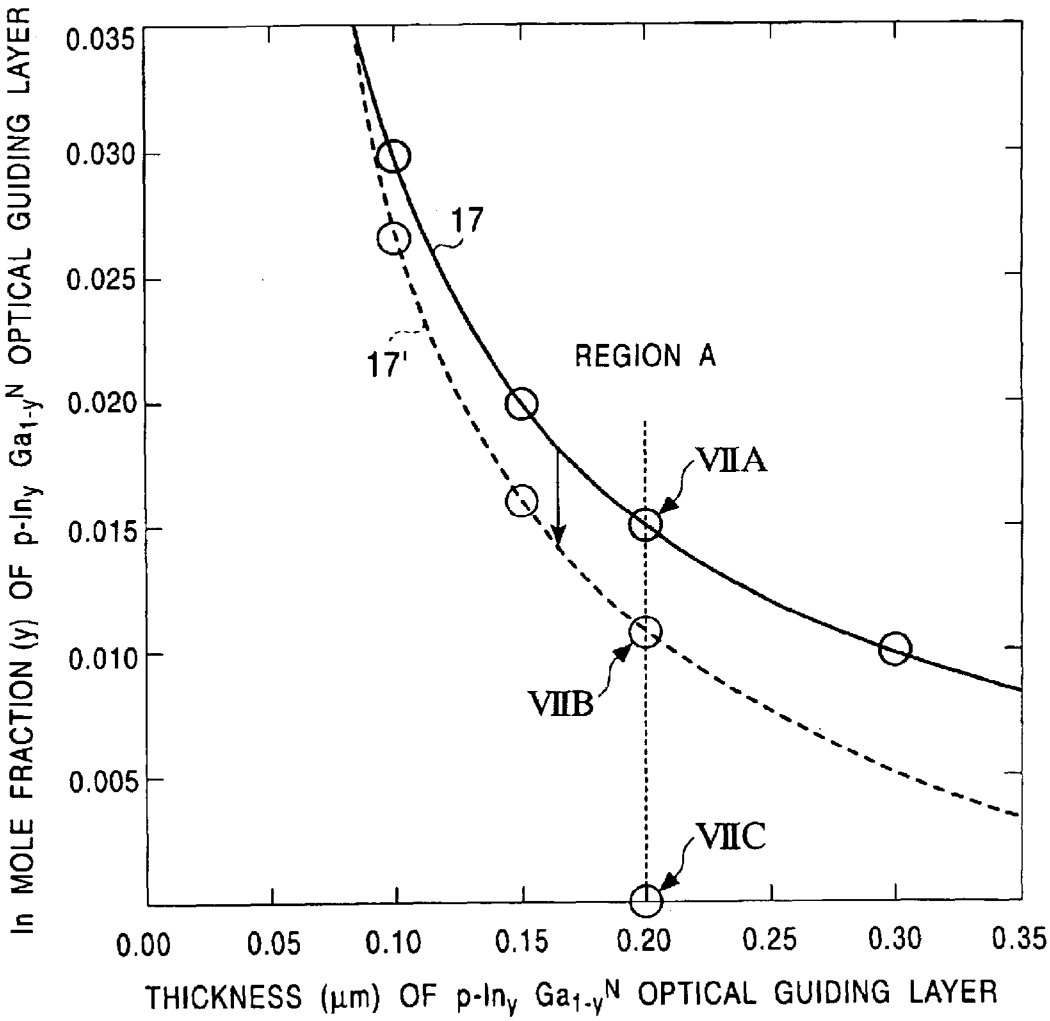
FIG. 6 is a matrix diagram showing the far-field patterns of the laser device as the thickness of a optical guiding layer and the In mole fraction are changed.

As shown in FIG. 6, a curve 17 shows a (boundary) condition which ensures no optical field leakage and provides a single-peak far field pattern, thus ensuring the most desirable emission characteristic. It was found that the curve 17 satisfied the relationship of yt=0.003 between the In mole fraction y and the thickness t (μm) of the p-side optical guiding layer. In additional consideration of FIG. 2, when the In mole fraction y is lower than that in the curve 17, the emission characteristic drastically becomes poor whereas even when the In mole fraction y is shifted higher than that in the curve 17, the emission characteristic is not degraded much. That is, an area A the upper portion of the area bisected by the curve 17, which includes the curve 17 and wherein the film thickness is large and the In mole fraction y is large, provides a desirable single-peak far field pattern.

Figure 8:
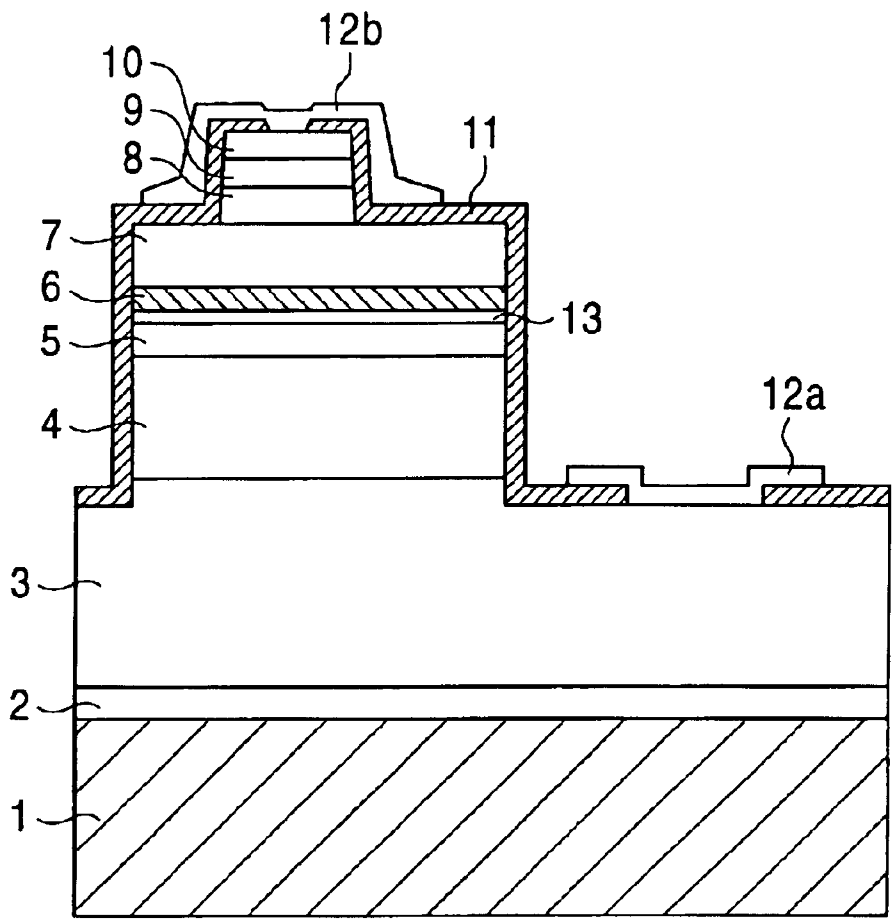
FIG. 8 is a cross-sectional view of another III–V nitride semiconductor laser device according to the present invention.
Figure 9:
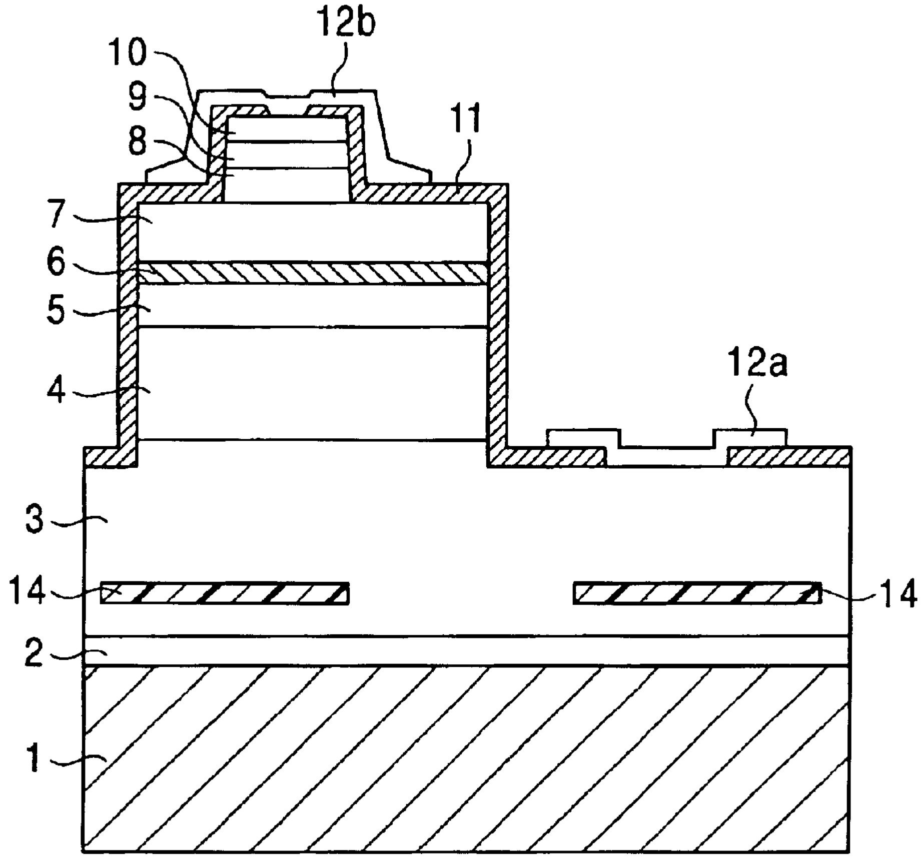
FIG. 9 is a cross-sectional view of a different III–V nitride semiconductor laser diode according to the present invention.

As shown in FIG. 8, an intermediate layer 13 of InGaN of about 500 Å, preferably, 300 Å may be provided between the optical guiding layer 5 and the active layer 6. When InGaN is formed to a thickness of about 300 Åor greater by MOCVD, pits occur on the surface of the InGaN layer after growth, as described earlier. It is known that the pits are initiated from the dislocation portion in the underlying InGaN layer. When the n-side cladding layer 4 and the n-side optical guiding layer 5 are grown on the base layer 3 having dislocations and the intermediate layer 13 of InGaN having a thickness of about 500 Å or less is further formed on the optical guiding layer 5, as shown in FIG. 8, fine pits occur in the surface of the intermediate layer 13. As the active layer 6 is grown on the intermediate layer 13, the active layer 6 grows in such a way as to avoid an area over the fine pits or the dislocations from the base layer 3. While the dislocations that penetrate the active layer 6 act as the non-radiative recombination center, the wasted current by non-radiative recombination can be reduced in the active layer 6 that grows in such a way as to avoid the dislocation with the InGaN intermediate layer 13 inserted under the active layer 6. This can suppress an increase in threshold current density, which is desirable. Pits of a certain or greater size are undesirable as it interferes with the planarization of the active layer 6 and scatters the wave guided light.

A dotted curve 17' in FIG. 6 shows the relationship that satisfies the same condition of the curve 17 (i.e., the boundary condition that improves the emission characteristic) when the intermediate layer 13 is provided. Given that the thickness of the optical guiding layer 8 unchanged, the condition extends in the direction of reducing the mole fraction, as compared with the case where the InGaN intermediate layer 13 is not provided.

It was also confirmed that a laser device with an excellent far field pattern could be provided even in the case where a laser structure was provided on a thick base prepared by a technique, such as ELO (Epitaxial Laterally Overgrowth), which formed a mask layer 14 of $SiO_2$ or the like inside the n-side GaN base layer 3 and hastened the growth of GaN in the lateral direction to reduce the dislocation density in a semiconductor layer above the mask.

As the present invention can provide a semiconductor laser device which demonstrates an excellent emission characteristic without increasing the thicknesses of the constituting layers of the device, it does not increase the production cost.

This application is based on Japanese Patent Application No. 2000-283393 which is hereby incorporated by reference.

What is claimed is:

1. A III–V nitride semiconductor laser device comprising:

an n-side AlGaN cladding layer;

an n-side GaN guide layer formed over the n-side AlGaN cladding layer;

an active layer formed over the n-side guide layer;

a p-side $In_yGa_{1-y}N(0<y\leqq 1)$ guide layer formed over the active layer; and a p-side AlGaN cladding layer formed over the p-side guide layer, wherein a refractive index of said p-side guide layer being larger than that of said n-side guide layer.

2. The III–V nitride semiconductor laser device according to claim 1, wherein said p-side guide layer has a thickness of 0.05 μm or greater.

3. The III–V nitride semiconductor laser device according to claim 1, wherein said p-side guide layer is formed of $In_yGa_{1-y}N$ where y is 0.005 or larger.

4. The III–V nitride semiconductor laser device according to claim 1, further comprising an intermediate layer of InGaN between said n-side guide layer and said active layer.

5. The III–V nitride semiconductor laser device according to claim 4, wherein said intermediate layer has a thickness of 500 angstroms or less.

6. The group-III nitride semiconductor laser device according to claim 1, further comprising a pit nucleating layer of InGaN between said n-side guide layer and said active layer.

7. The group-III nitride semiconductor laser device according to claim 6, wherein said pit nucleating layer has a thickness of 500 angstroms or less.

* * * * *